(12) United States Patent
Liu et al.

(10) Patent No.: US 11,127,708 B2
(45) Date of Patent: Sep. 21, 2021

(54) PACKAGE STRUCTURE AND METHOD OF MANUFACTURING THE SAME

(71) Applicant: Taiwan Semiconductor Manufacturing Co., Ltd., Hsinchu (TW)

(72) Inventors: Ming-Kai Liu, Hsinchu (TW); Han-Ping Pu, Taichung (TW); Ting-Chu Ko, Hsinchu (TW); Yung-Ping Chiang, Hsinchu County (TW); Chang-Wen Huang, Hsinchu (TW); Yu-Sheng Hsieh, New Taipei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/676,439

(22) Filed: Nov. 7, 2019

(65) Prior Publication Data
US 2020/0075526 A1 Mar. 5, 2020

Related U.S. Application Data

(63) Continuation of application No. 15/717,974, filed on Sep. 28, 2017, now Pat. No. 10,504,865.

(51) Int. Cl.
*H01L 23/00* (2006.01)
*H01L 25/10* (2006.01)
*H01L 23/538* (2006.01)

(52) U.S. Cl.
CPC .......... *H01L 24/25* (2013.01); *H01L 23/5389* (2013.01); *H01L 24/19* (2013.01); *H01L 24/24* (2013.01); *H01L 25/105* (2013.01); *H01L 2224/04105* (2013.01); *H01L 2224/12105* (2013.01); *H01L 2224/2402* (2013.01); *H01L 2224/24101* (2013.01); *H01L 2224/24137* (2013.01); *H01L 2224/25171* (2013.01); *H01L 2224/25174* (2013.01); *H01L 2224/25175* (2013.01); *H01L 2224/32225* (2013.01); *H01L 2224/73265* (2013.01); *H01L 2224/73267* (2013.01); *H01L 2224/92244* (2013.01);
(Continued)

(58) Field of Classification Search
CPC ......... H01L 24/25; H01L 24/24; H01L 24/19; H01L 23/5389; H01L 25/105
See application file for complete search history.

(56) References Cited

U.S. PATENT DOCUMENTS 8,330,279 B2 * 12/2012 Miki ................ H01L 24/97
257/779
9,000,584 B2 4/2015 Lin et al.
(Continued)

*Primary Examiner* — Nathan W Ha
(74) *Attorney, Agent, or Firm* — JCIPRNET

(57) ABSTRACT

Provided are a package structure and a method of manufacturing the same. The method includes the following processes. A die is provided. An encapsulant is formed laterally aside the die. A first dielectric layer is formed on the encapsulant and the die. A first redistribution layer is formed to penetrate through the first dielectric layer to connect to the die, the first redistribution layer includes a first via embedded in the first dielectric layer and a first trace on the first dielectric layer and connected to the first via. The first via and the first trace of the first redistribution layer are formed separately.

20 Claims, 15 Drawing Sheets

(52) U.S. Cl.
CPC ............... *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/15311* (2013.01)

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2004/0033654 A1* | 2/2004 | Yamagata ............... H01L 24/82 438/202 |
| 2005/0140007 A1* | 6/2005 | Jobetto ................... H01L 24/29 257/738 |
| 2009/0237900 A1* | 9/2009 | Origuchi ................. H01L 24/82 361/763 |
| 2010/0044845 A1* | 2/2010 | Funaya ............... H01L 21/6835 257/685 |

\* cited by examiner

PACKAGE STRUCTURE AND METHOD OF MANUFACTURING THE SAME

CROSS-REFERENCE TO RELATED APPLICATION

This application is a continuation application of and claims the priority benefit of a prior application Ser. No. 15/717,974, filed on Sep. 28, 2017, now allowed. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. In the integrated fan-out packages, the formation of the redistribution circuit structure plays an important role during packaging process.

DETAILED DESCRIPTION

Figure 1A:
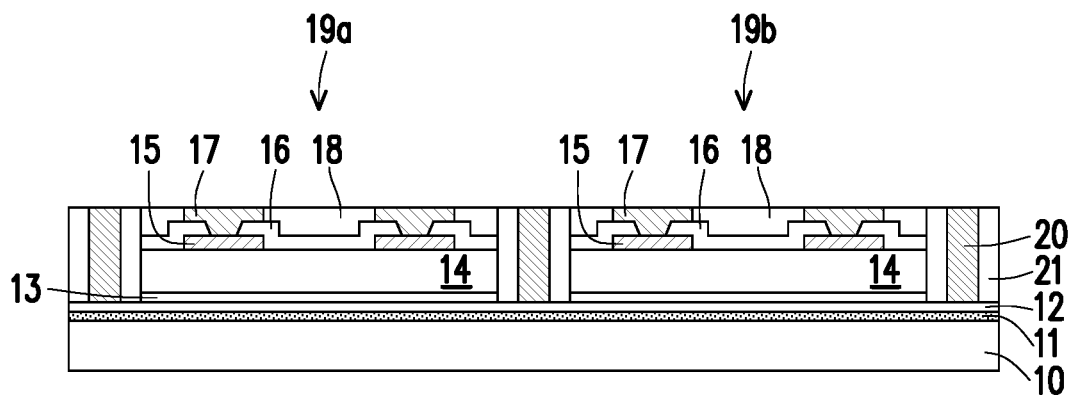
FIG. 1A to FIG. 1L are schematic cross-sectional views illustrating a method of forming a package structure according to a first embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1L are schematic cross-sectional views illustrating a method of forming a package structure according to a first embodiment of the disclosure.

Referring to FIG. 1A, a carrier 10 is provided. The carrier 10 may be a glass carrier, a ceramic carrier, or the like. A release layer 11 is formed on the carrier 10 by, for example, a spin coating method. In some embodiments, the release layer 11 may be formed of an adhesive such as an Ultra-Violet (UV) glue, a Light-to-Heat Conversion (LTHC) glue, or the like, or other types of adhesives. The release layer 11 is decomposable under the heat of light to thereby release the carrier 10 from the overlying structures that will be formed in subsequent steps.

A dielectric layer 12 is formed over the release layer 11. In some embodiments, the dielectric layer 12 is a polymer layer. The polymer includes, for example, polyimide, polybenzoxazole (PBO), benzocyclobutene (BCB), Ajinomoto Buildup Film (ABF), Solder Resist film (SR), or the like. The dielectric layer 12 is formed by a suitable fabrication technique such as spin-coating, lamination, deposition, or the like.

Still referring to FIG. 1A, two dies 19a and 19b are attached to the dielectric layer 12 over the carrier 10 through an adhesive layer 13, respectively. The adhesive layer 13 includes a die attach film (DAF), silver paste, or the like. In some embodiments, the two dies 19a and 19b are different types of dies or the same types of dies and may be application-specific integrated circuit (ASIC) chips, analog chips, sensor chips, wireless and radio frequency chips, voltage regulator chips or memory chips. In some other embodiments, the two dies 19a and 19b are two small die partitions with different function of a larger single die. In this embodiment, two dies 19a and 19b are disposed over the carrier 10, but the disclosure is not limited thereto. In some other embodiments, one die, or more than two dies, or a wafer including a plurality of dies arranged in an array may be disposed over the carrier 10 (not shown).

In some embodiments, the structure of the die 19a is substantially the same as the structure of the die 19b. Take the die 19a for example, the die 19a includes a substrate 14, a plurality of pads 15, a passivation layer 16, a plurality of connectors 17 and a passivation layer 18. The pads 15 may be a part of an interconnection structure (not shown) and electrically connected to the integrated circuit devices (not shown) formed on the substrate 14. The passivation layer 16 is formed over the substrate 14 and covers a portion of the pads 15. A portion of the pads 15 is exposed by the passivation layer 16 and serves as an external connection of the die 19a. The connectors 17 are formed on and electrically connected to the pads 15 not covered by the passivation layer 16. The connector 17 includes solder bumps, gold bumps, copper bumps, copper posts, copper pillars, or the like. The passivation layer 18 is formed over the passivation layer 16 and aside the connectors 17 to cover the sidewalls of the connectors 17. The passivation layers 16 and 18 respectively include an insulating material such as silicon oxide, silicon nitride, polymer, or a combination thereof. The materials of the passivation 16 and the passivation layer 18 may be the same or different. In some embodiments, the top surface of the passivation layer 18 is substantially level with the top surface of the connectors 17.

Still referring to FIG. 1A, in some embodiments, a plurality of through integrated fan-out vias (TIVs) 20 are formed over the carrier 10 and aside the two dies 19a and 19b. In some embodiments, the TIVs 20 are formed on the dielectric layer 12. The TIVs 20 include copper, nickel, solder, alloys thereof, or the like. In some embodiments, the TIVs 20 further include a barrier layer to prevent metal diffusion. An exemplary forming method of the TIVs 20 includes forming a photoresist layer such as a dry film resist over the carrier 10. Thereafter, openings are formed in the photoresist layer, and the TIVs 20 are then formed in the openings by electroplating. Afterwards, the photoresist layer is stripped. In some embodiments, the top surface of the TIVs 20 is substantially level with the top surface of the connectors 17. In some other embodiments, there has no TIVs 20 formed aside the die 19a and 19b.

An encapsulant 21 is then formed over the carrier 10 to encapsulate the sidewalls of the dies 19a and 19b and the TIVs 20. In some embodiments, the encapsulant 21 includes a molding compound, a molding underfill, a resin such as epoxy, a combination thereof, or the like. In some embodiments, the encapsulant 21 includes a photo-sensitive material such as PBO, polyimide, BCB, a combination thereof, or the like, which may be easily patterned by exposure and development processes. In alternative embodiments, the encapsulant 21 includes nitride such as silicon nitride, oxide such as silicon oxide, phosphosilicate glass (PSG), borosilicate glass (BSG), boron-doped phosphosilicate glass (BPSG), a combination thereof, or the like. The encapsulant 21 is formed by forming an encapsulant material layer over the carrier 10 by a suitable fabrication technique such as spin-coating, lamination, deposition, or similar processes. The encapsulant material layer encapsulates the top surfaces and sidewalls of the dies 19a and 19b and the TIVs 20. Thereafter, a grinding or polishing process is performed to remove a portion of the encapsulant material layer, such that the top surfaces of the connectors 17 and the TIVs 20 are exposed. In some embodiments, the top surface of the encapsulant 21 is substantially level with the top surfaces of the connectors 17 and the TIVs 20.

Figure 1B:
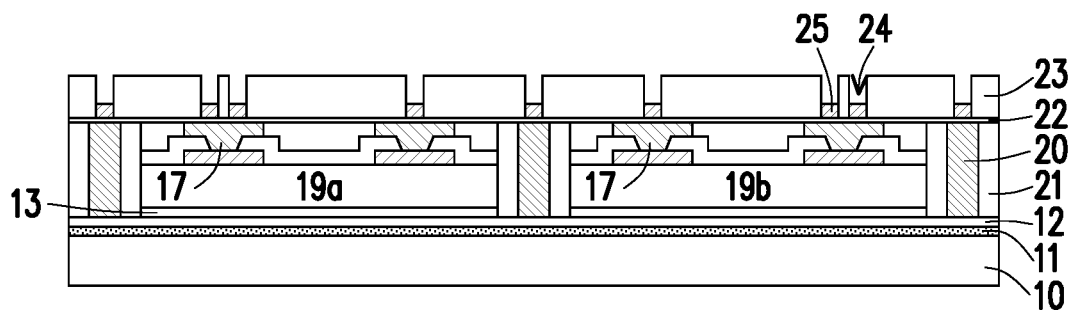

Referring to FIG. 1B, a seed layer 22 is formed over the carrier 10 to cover the dies 19a and 19b, the TIVs 20 and the encapsulant 21. In some embodiments, the seed layer 22 is a copper seed layer or other suitable metal seed layer. The seed layer 22 may be a single layer structure or multi-layer structure. In some exemplary embodiments, the seed layer 22 is a two-layer structure including a first metal layer such as a titanium layer (not shown) and a second metal layer such as a copper layer (not shown) over the first metal layer. The seed layer 22 is formed by, for example, physical vapor deposition (PVD). In some embodiments, PVD includes sputtering deposition, vapor deposition, or any other suitable method.

Still referring to FIG. 1B, a patterned mask layer 23 is formed on the seed layer 22. The patterned mask layer 23 has a plurality of openings 24, exposing a portion of the seed layer 22 on the connectors 17 and on the TIVs 20. The patterned mask layer 23 is, for instance, a photoresist. The patterned mask layer 23 is formed by, for instance, forming a photoresist layer on the seed layer 22 at first, and then performing exposure and development processes on the photoresist layer.

Still referring to FIG. 1B, a conductive layer 25 is formed in the openings 24 by, for example, electroplating, or electroless plating. The conductive layer 25 includes, for instance, copper or other suitable metals. The material of the conductive layer 25 is the same as or different from the material of the seed layer 22.

Figure 1C:
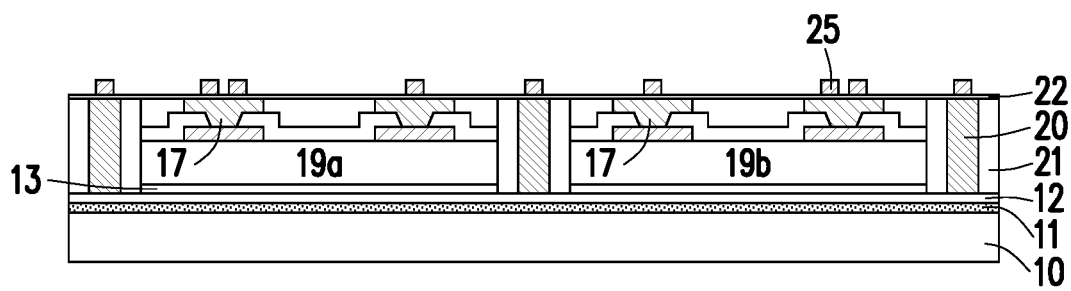
Figure 1D:
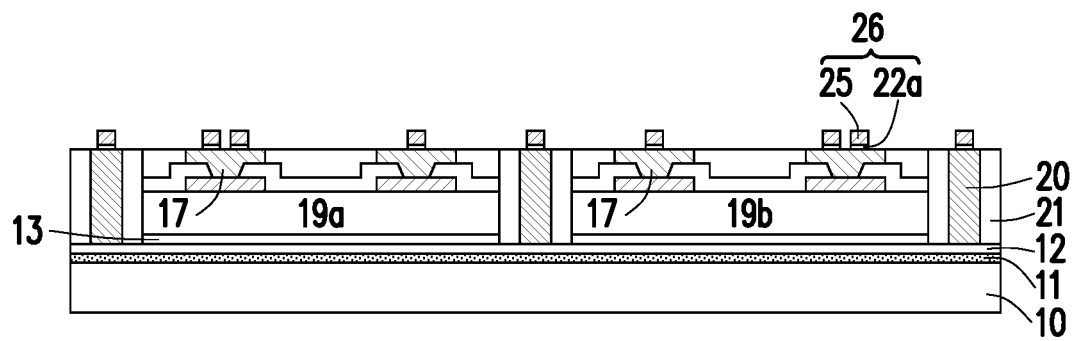

Referring to FIG. 1C and FIG. 1D, the patterned mask layer 23 is then removed by a dry strip, a wet strip or a combination thereof, for example. The seed layer 22 not covered by the conductive layer 25 is then removed with the conductive layer 25 as a mask, so as to form a seed layer 22a. The removal method includes an etching process such as an anisotropic process. The anisotropic process includes a dry etching process, a wet etching process or a combination thereof.

Referring to FIG. 1D, the conductive layer 25 and the underlying seed layer 22a form a plurality of vias 26. The vias 26 are located on and in electrical contact with the connectors 17 or/and the TIV 20. In some embodiments, one via 26 is disposed on one connector 17, but the disclosure is not limited thereto. In some other embodiments, two vias 26 are disposed on one connector 17. The connector 17 has a portion not covered by the via 26 and is exposed.

Figure 2:
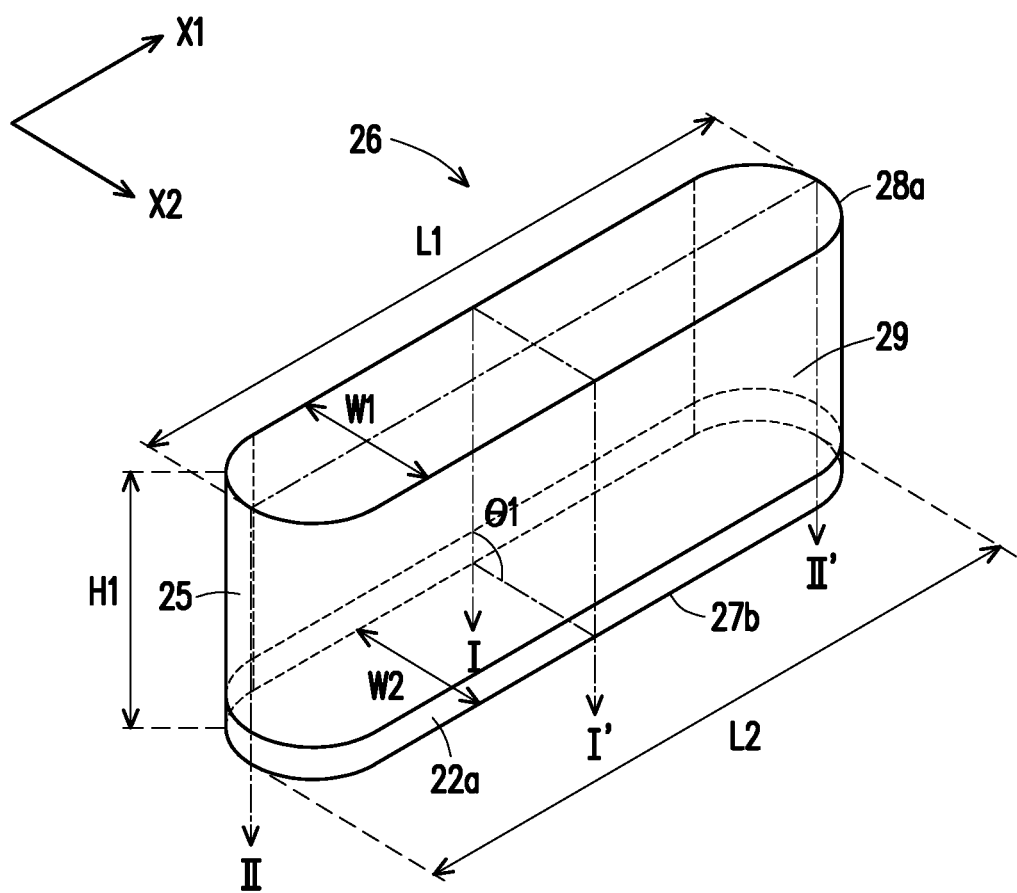
FIG. 2 is perspective view of a via of a package structure according to the first embodiment of the disclosure.
Figure 3A:
FIG. 3A to FIG. 3E are the examples illustrating the shape of the top surface and bottom surface of a via according to some embodiments of the disclosure.
Figure 3B:
Figure 3C:
Figure 3D:
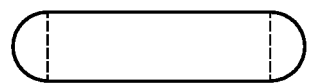
Figure 3E:
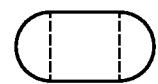

FIG. 2 is the perspective view of the via 26 in FIG. 1D according to some embodiments of the present disclosure.

Referring to FIG. 2, in some embodiments, the via 26 is an elongated via and has a columnar structure. Here, the elongated via refers to a via having longitudinal sides. A top surface 28a or a bottom surface 27b of the via 26 has a first side along a first direction X1 and a second side along a second direction X2. In some embodiments, the first direction X1 and the second direction X2 are perpendicular to each other. The length of the first side is different from the length of the second side. Take the top surface 28a for example, the longest length of the first side (that is the length L1 of the top surface 28a) is quite larger than the longest length of the second side (that is the width W1 of the top surface 28a).

Referring to FIGS. 3A to 3E, in some embodiments, the bottom surface 27b and the top surface 28a are configured as a same shape, such as oval (FIG. 3A), rectangle (FIG. 3B), corner rounded rectangle (FIG. 3C), racetrack (a combination of a rectangle and two arcs) (FIG. 3D), a combination of a square and two arcs (FIG. 3E), or a combination thereof. The bottom surface 27b and the top surface 28a may have the same size or different size. In some embodiments, the bottom surface 27b and the top surface 28a have the same size and same shape, that is the via 26 has a columnar structure.

Referring to FIG. 2, in some embodiments, the cross-section shape along an I-I' line of the via 26 is, for instance, rectangle or square. The cross-section shape along a II-II' line of the via 26 is, for instance, rectangle or square. A base angle θ1 of the via 26, that is the angle between the sidewall 29 and the bottom surface 27b of the via 26 is a right angle (that is, equal to 90°) in some embodiments.

Still referring to FIG. 2, the area A1 of the top surface 28a substantially equals to the area A2 of the bottom surface 27b. The length L1 of the top surface 28a and the length L2 of the bottom surface 27b are substantially the same and range from 2.2 μm to 20 μm. The width W1 of the top surface 28a and the width W2 of the bottom surface 27b are substantially the same and range from 2 μm to 10 μm. In some embodiments, the ratio of the length L1 to the width W1 ranges from 1.1 to 5. The height H1 of the via 26 ranges from 2 μm to 8 μm. In some embodiments, the aspect ratio (H1:W1 or H1:W2) of the via 26 is less than 2.

Figure 1E:
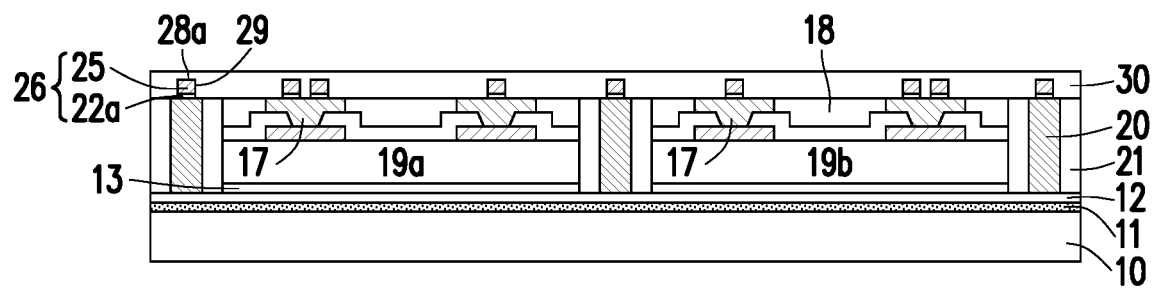

Referring to FIG. 1E, after the via 26 is formed, a first dielectric layer 30 is formed over the carrier 10 to cover the top surface 28a and the sidewalls 29 of the via 26, the passivation layer 18, the connectors 17, the TIVs 20 and the encapsulant 21. The material of the first dielectric layer 30 includes an inorganic dielectric material, an organic dielectric material, or a combination thereof. The inorganic dielectric material includes a nitride such as silicon nitride, an oxide such as silicon oxide, an oxynitride such as silicon oxynitride, PSG, BSG, BPSG, or the like, or a combination thereof. The organic dielectric material includes a polymer, which may be a photosensitive material such as PBO, PI, BCB, ABF, SR, or the like, or a combination thereof. The first dielectric layer 30 is formed by a suitable fabrication technique such as spin-coating, lamination, deposition, or the like.

Figure 1F:
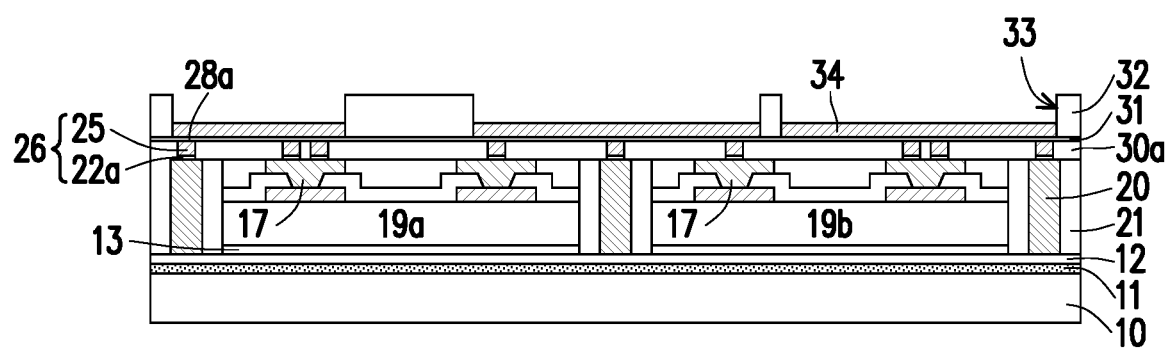

Referring to FIG. 1E and FIG. 1F, a portion of the first dielectric layer 30 is removed by a grinding or polishing process such as a chemical mechanical polishing (CMP) process with the conductive layer 25 as a stop layer, such that a first dielectric layer 30a is formed and the top surface 28a of the via 26 is exposed. In some embodiments, the top surface of the first dielectric layer 30a is substantially level with the top surface 28a of the via 26.

Figure 1G:
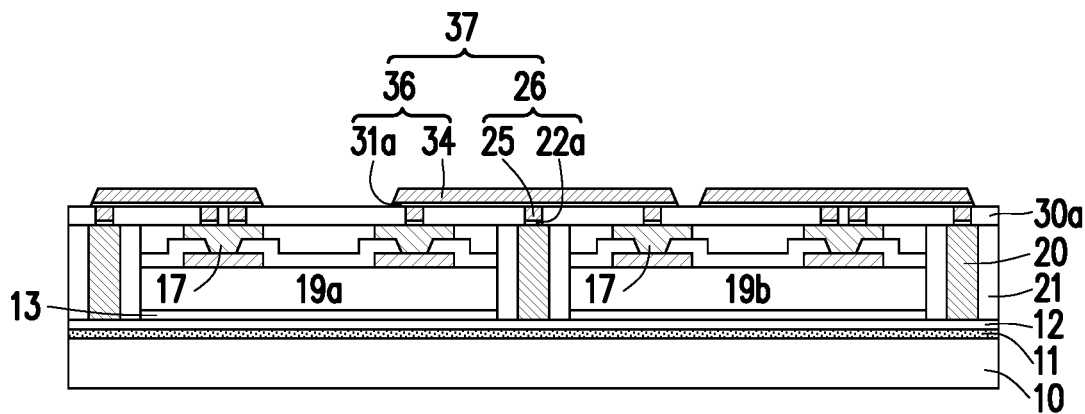

Referring to FIG. 1G, traces 36 are formed on the vias 26 and the first dielectric layer 30a, and are in contact with and electrically connected to the vias 26. In some embodiments, one of the traces 36 electrically connects the via 26 on the connector 17 of the die 19a and the via 26 on the connector 17 of the die 19b, such that the die 19a and the die 19b are electrically connected to each other. The traces 36 and the vias 26 form a first redistribution layer (RDL) 37. That is to say, the two dies 19a and 19b are electrically connected through the first RDL 37. In some embodiments, the traces 36 include a conductive layer 34 and a seed layer 31a and the forming method is described as below.

Referring to FIG. 1F, a seed layer 31 is formed on the first dielectric layer 30a to cover the top surface of the first dielectric layer 30a and the top surfaces 28a of the vias 26. The material and the forming method of the seed layer 31 is substantially the same as those of the seed layer 22, which will not be described again. The seed layer 31 is in contact with and electrically connected to the vias 26. Thereafter, a patterned mask layer 32 is formed on the seed layer 31. The patterned mask layer 32 has a plurality of openings 33, exposing the seed layer 31 on the vias 26 and a portion of the seed layer 31 on the first dielectric layer 30a. The conductive layer 34 is formed on the seed layer 31 exposed by the openings 33. The material and forming method of the conductive layer 34 is similar to those of the conductive layer 25.

Referring to FIG. 1F and FIG. 1G, the patterned mask layer 32 is then removed, such that the seed layer 31 not covered by the conductive layer 34 is exposed. In some embodiments, the seed layer 31 not covered by the conductive layer 34 is then removed with the conductive layer 34 as a mask, so as to form the seed layer 31a. The removal method includes an etching process, such as a dry etching process, a wet etching process, or a combination thereof. In some embodiments, a portion of the conductive layer 34 is also removed during the etching process.

Figure 1H:
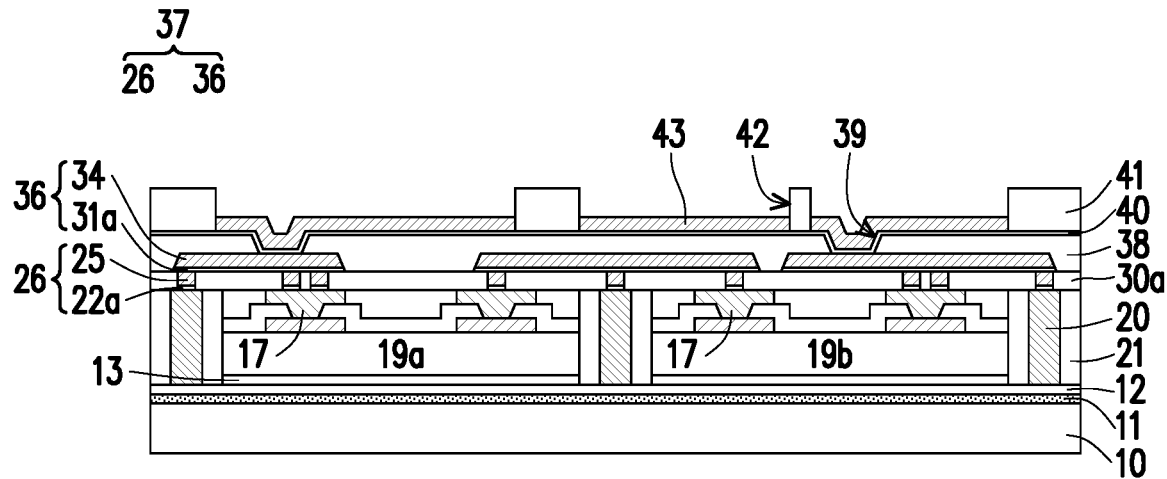

Referring to FIG. 1H, a second dielectric layer 38 is formed on the first dielectric layer 30a and on the traces 36. The second dielectric layer 38 has a plurality of openings 39 exposing a portion of the top surface of the traces 36 of the first RDL 37. The material of the second dielectric layer 38 is similar to that of the dielectric layer 30a. The materials of the second dielectric layer 38 and the first dielectric layer 30a may be the same or different. The second dielectric layer 38 is formed by forming a dielectric material layer (not shown) at first by a suitable fabrication technique such as spin-coating, lamination, deposition, or the like, thereafter, a portion of the dielectric material layer on the trace 36 is removed by, for example, a laser drilling process, an etching process, or a combination thereof.

Thereafter, a seed layer 40 is formed on the second dielectric layer 38. In some embodiments, the material and the forming method of the seed layer 40 are similar to those of the seed layer 31 and the seed layer 22, which will not be described again. The seed layer 40 covers the top surface of the second dielectric layer 38, fills into the openings 39 and covers the sidewalls and the bottom surface of the openings 39. In other word, the seed layer 40 is in contact with and electrically connected to the trace 36 of the first RDL 37 at the bottom of openings 39.

Still referring to FIG. 1H, a patterned mask layer 41 is formed on the seed layer 40. The patterned mask layer 41 has a plurality of openings 42, exposing the seed layer 40 in the openings 39 and a portion of the seed layer 40 on the second dielectric layer 38.

A conductive layer 43 is then formed on the seed layer 40 exposed by the openings 42 of the pattern mask layer 41. The material and the forming method of the conductive layer 43 are similar to those of the conductive layer 34 and the conductive layer 25.

Figure 1I:
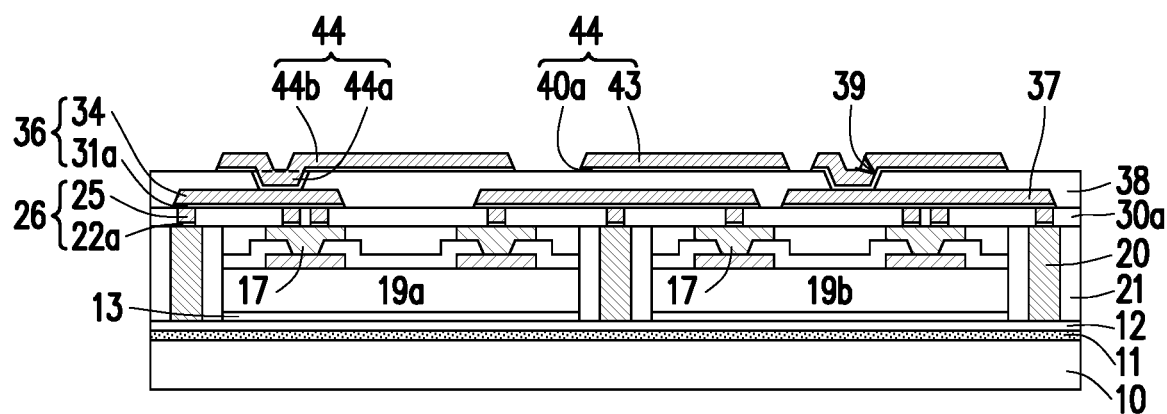

Referring to FIG. 1I, the patterned mask layer 41 is then removed, such that the seed layer 40 not covered by the conductive layer 43 is exposed. In some embodiments, the seed layer 40 not covered by the conductive layer 43 is then removed with the conductive layer 43 as a mask, so as to form a seed layer 40a. The removal method includes an etching process, such as a dry etching process, a wet etching process, or a combination thereof. In some embodiments, a portion of the conductive layer 43 is also removed during the etching process.

Still referring to FIG. 1I, the seed layer 40a and the conductive layer 43 form a second RDL 44. The second RDL 44 is disposed on the first RDL 37, and is in contact with and electrically connected to the first RDL 37. The second RDL 44 includes vias 44a and traces 44b. The cross-section shape of the via 44a is, for example, inverted trapezoid. The top width of the via 44a is larger than the bottom width of the via 44a. The forming method of the second RDL 44 described above is just an example of the disclosure, and the disclosure is not limited thereto.

Figure 1J:
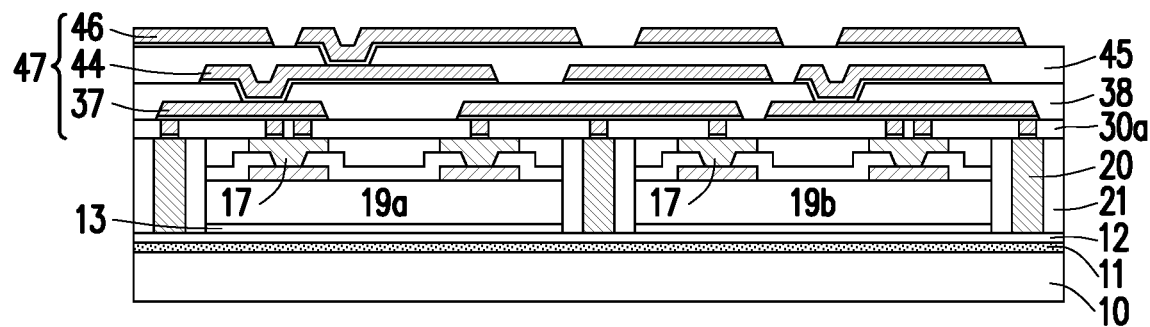

Referring to FIG. 1J, processes similar to those of FIGS. 1H to 1J are performed to form a third dielectric layer 45 and a third RDL 46 over the second RDL 44. The material, the forming method and the structural characteristic of the third dielectric layer 45 and the third RDL 46 are substantially similar to those of the second dielectric layer 38 and the second RDL 44, respectively, which will not be described again. The first dielectric layer 30a, the first RDL 37, the second dielectric layer 38, the second RDL 44, the third dielectric layer 45 and the third RDL 46 together form a RDL structure 47. The RDL structure 47 is disposed on and electrically connected to the connectors 17 of the die 19a and 19b. In some embodiments, the two dies 19a and 19b are electrically connected with each other through the RDL structure 47.

Figure 1K:
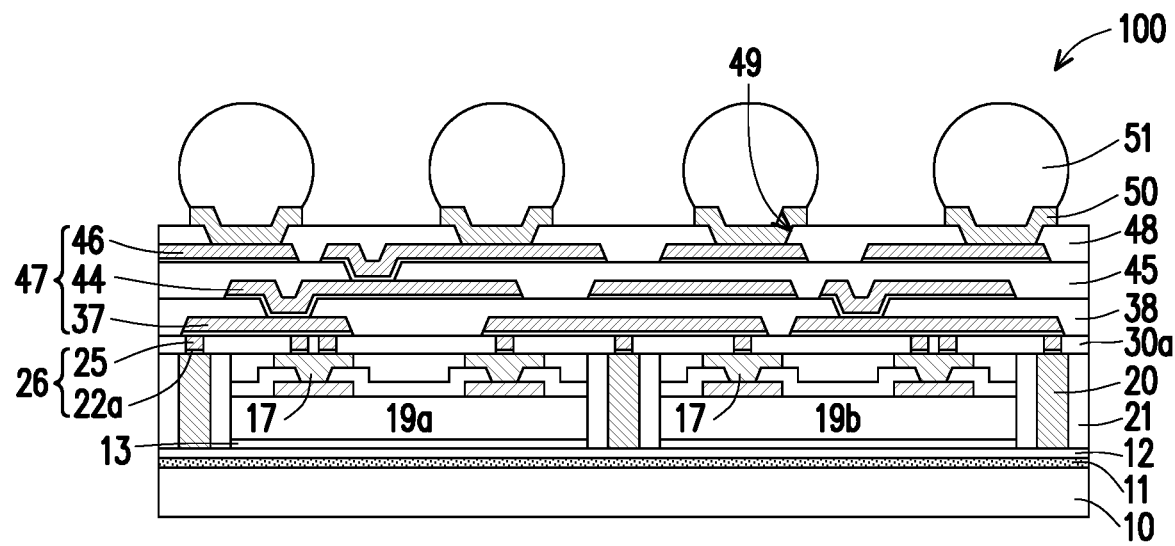

Referring to FIG. 1K, a passivation layer 48 is formed on the RDL structure 47. The passivation layer 48 may be a single layer or a multilayer structure, the material thereof is an insulating material, such as silicon oxide, silicon nitride, a polymer, or a combination thereof. The polymer may be a photosensitive material, a non-photosensitive material, or a combination thereof. The polymer is, for instance, PBO, polyimide, BCB, or a combination thereof. The passivation layer 48 is formed by, for instance, a chemical vapor deposition, spin coating, or a combination thereof. A plurality of windows 49 are formed in the passivation layer 48. The window 49 exposes a portion of the third RDL 46 of the RDL structure 47. In some embodiments, the method of forming the window 49 includes exposure and development processes. In other embodiments, the method of forming the window 49 includes photolithography and etching processes.

Still referring to FIG. 1K, in some embodiments, a conductive layer 50 is selectively formed on the third RDL 46 exposed by the window 49. The conductive layer 50 is also referred to as under-ball metallurgy (UBM). In some embodiments, the conductive layer 50 covers the sidewalls and the bottom of the window 49 and extends over the passivation layer 48 to cover the corner of the passivation layer 48. The material of the conductive layer 50 includes a metal or a metal alloy. The conductive layer 50 is, for example, copper, tin, an alloy thereof, or a combination thereof. The conductive layer 50 is formed by, for instance, physical vapor deposition or electroplating. The conductive layer 50 is electrically connected to the RDL structure 47.

Thereafter, a plurality of connectors (also referred to as conductive balls) 51 is placed on the conductive layer 50. The material of the connector 51 includes copper, aluminum, lead-free alloys (e.g., gold, tin, silver, aluminum, or copper alloys) or lead alloys (e.g., lead-tin alloys). In some embodiments, the connectors 51 are placed on the conductive layer 50 by a ball mounting process. The connectors 51 are electrically connected to the connectors 17 of the die 19a/19b through the conductive layer 50 and the RDL structure 47.

Referring to FIG. 1K, a package structure 100 disposed over the carrier 10 is thus completed. The package structure 100 includes the dies 19a and 19b, the encapsulant 21, the TIVs 20, the RDL structure 47, and the connectors 51. The connectors 51 are electrically connected to the connectors 17 of the dies 19a and 19b and the TIVs 20 through the RDL structure 47. The via 26 of the first RDL 37 is elongated.

Figure 1L:
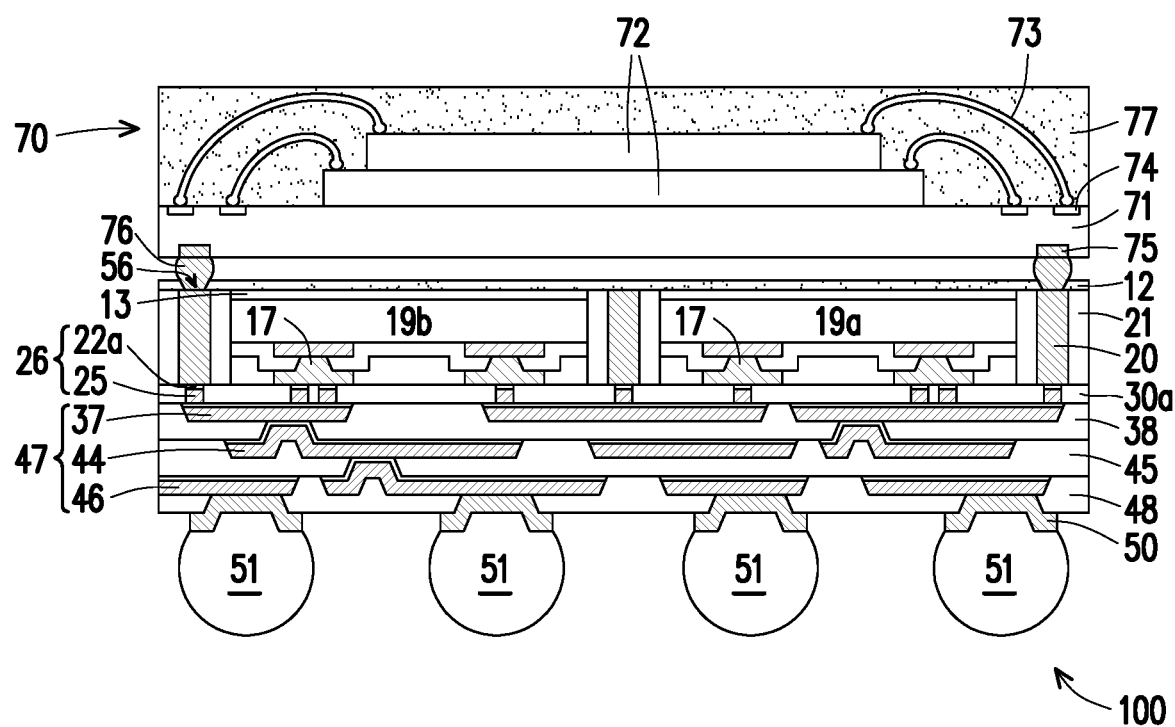

Referring to FIG. 1K and FIG. 1L, the package structure 100 over the carrier 10 is turned over, the release layer 11 is decomposed under the heat of light, and the carrier 10 is then released from the package structure 100. In some embodiments, the package structure 100 may be further connected to other package structures. In some embodiments, after the carrier 10 is released, one or multiple openings 56 are formed in the dielectric layer 12 by a laser drilling process, for example. The opening 56 penetrates through the dielectric layer 12 and exposes a portion of the TIV 20. In some embodiments, the package structure 100 may further be electrically coupled to another package structure 70 to form a package-on-package (POP) device as illustrated in FIG. 1L, but the disclosure is not limited thereto.

Referring to FIG. 1L, in some embodiments, the package structure 70 has a substrate 71, and a die 72 is mounted on one surface (e.g. top surface) of the substrate 71. Bonding wires 73 are used to provide electrical connections between the die 72 and pads 74 (such as bonding pads) on the same top surface of the substrate 71. TIVs (not shown) may be used to provide electrical connections between the pads 74 and pads 75 (such as bonding pads) on an opposing surface (e.g. bottom surface) of the substrate 71. Connectors 76 connect the pads 75 and fill in the openings 56 to electrically connect to the TIVs 20 of the package structure 100. An encapsulant 77 is formed over the components to protect the components from the environment and external contaminants.

Figure 4A:
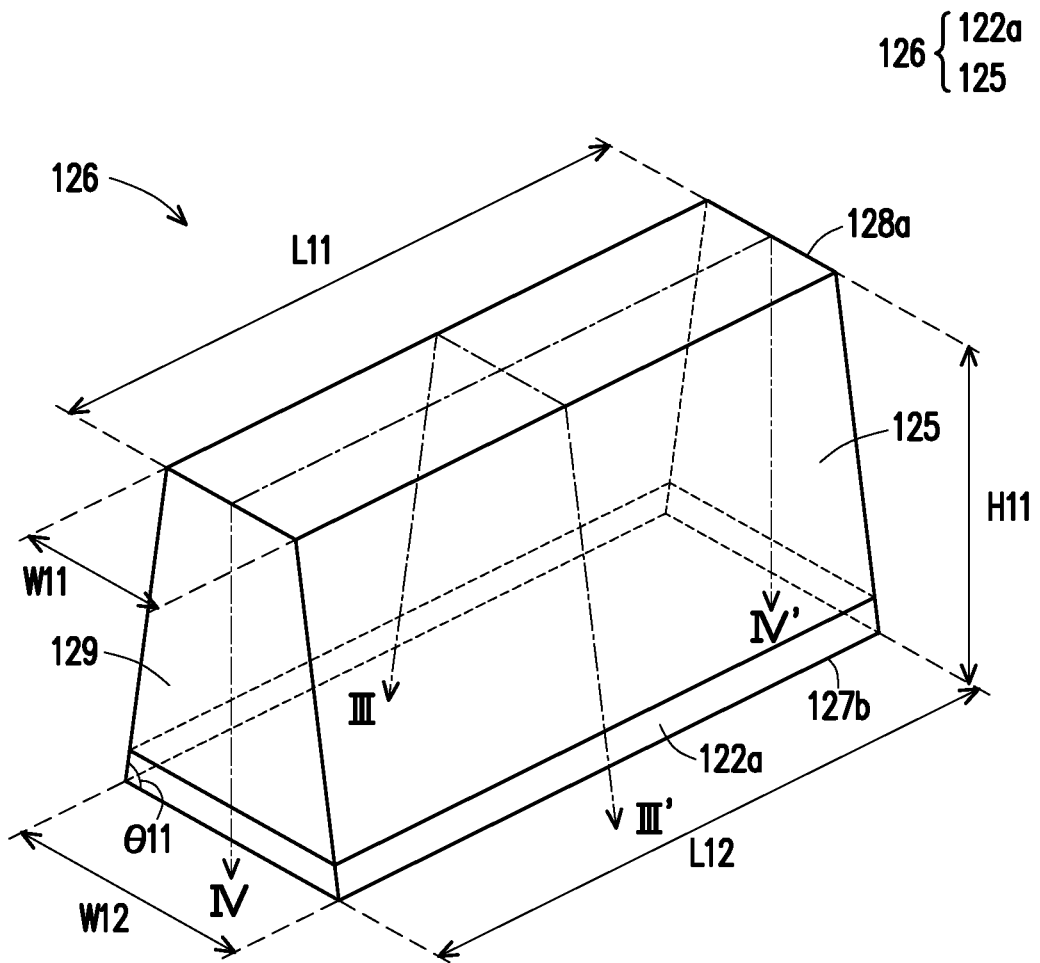
FIG. 4A to FIG. 4C are perspective views of a via of a package structure according to a second embodiment of the disclosure.
Figure 4B:
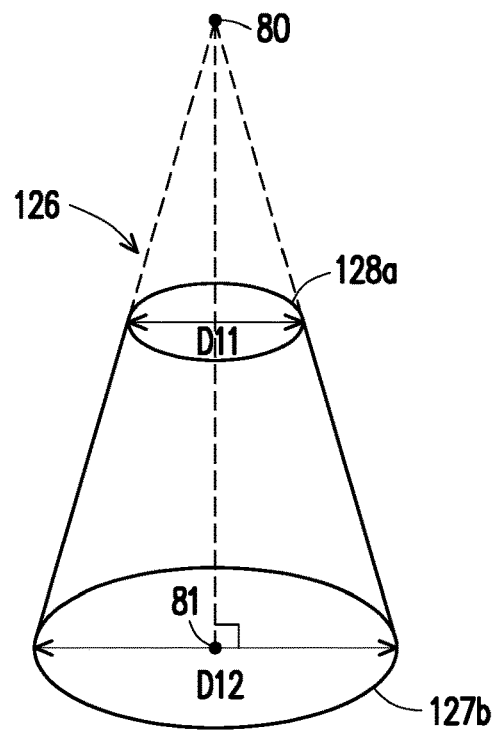

FIGS. 4A to 4B are perspective views of a via 126 of a package structure formed according to a second embodiment of the disclosure. The second embodiment differs from the first embodiment only in that the via 126 has a structure different from that of the via 26 in the first embodiment.

Referring to FIG. 1C and FIGS. 4A to 4C, in some embodiments, after the conductive layer 25 is formed on the seed layer 22, a treatment process is performed to remove a portion of the conductive layer 25 and a portion of the underlying seed layer 22, so that a conductive layer 125 and a seed layer 122a are formed. In some embodiments, the treatment process includes an isotropic etching process such as a wet etching process. The wet etching process may have a low etching selectivity ratio of the conductive layer 25 to the seed layer 22, such as hydrogen peroxide, phosphoric acid, or the like, or a combination thereof.

Figure 9:
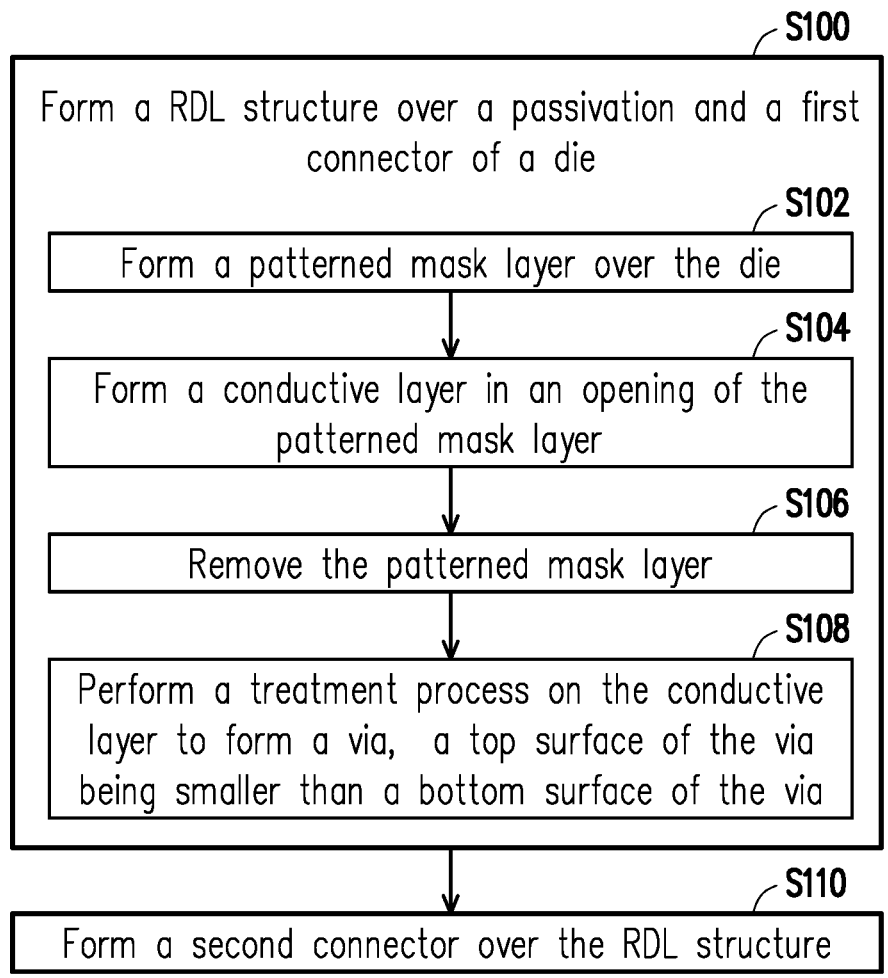
FIG. 9 is a flowchart of a method of forming a package structure according to some embodiments of the present disclosure.

Referring to FIG. 9, in other words, a method of manufacturing a package structure includes forming a RDL structure over a passivation and a first connector of a die (S100). The method of forming the RDL structure includes forming a patterned mask layer over the die (S102); forming a conductive layer in an opening of the patterned mask layer (S104); removing the patterned mask layer (S106); performing a treatment process on the conductive layer to form a via, a top surface of the via being smaller than a bottom surface of the via (S108); and forming a second connector over the RDL structure (S110).

Referring to FIG. 1C, FIG. 1K and FIG. 4A, after the treatment process is performed, the conductive layer 125 and the seed layer 122a form a via 126. The via 126 is tapered, or in the shape of a truncated cone. In other words, the treatment process is performed so that the via 126 is tapered away from the connector 17 of the die 19a or 19b, and tapered toward the connector 51 on the RDL structure 47. The via 126 has a bottom surface 127b and a top surface 128a. The shape of the bottom surface 127b and the shape of the top surface 128a may be the same or different. In some embodiments, the shape of the bottom surface 127b and the shape of the top surface 128a of the via 126 may be the same as those of the via 26 shown in FIGS. 3A to 3E. In some other embodiments, the shape of the bottom surface 127b and the top surface 128a of the via 126 may be square, circular, polygon, trapezoid, or a combination thereof. The area A12 of the bottom surface 127b is larger than the area A11 of the top surface 128a of the via 126. The ratio of the area A12 to the area A11 ranges from 1.1 to 25. The area A11 of the top surface 128a ranges from 4 μm² to 20 μm², and the area A12 of the bottom surface 127b ranges from 4.4 μm² to 100 μm². The details are described as below.

Still referring to FIG. 4A, in some embodiments, the cross-section shape along a III-III' line of the via 126 is, for instance, trapezoid. The cross-section shape along a IV-IV' line of the via 126 is, for instance, trapezoid. A base angle θ11 of the via 126, that is the angle between the sidewall 129 and the bottom surface 127b of the via 126 is an acute angle (that is, less than 90°). The width W11 of the top surface 128a is less than the width W12 of the bottom surface 127b. The length L11 of top surface 128a is less than the length L12 of the bottom surface 127b. The height H11 of the via 126 ranges from 2 μm to 8 μm.

Figure 4C:
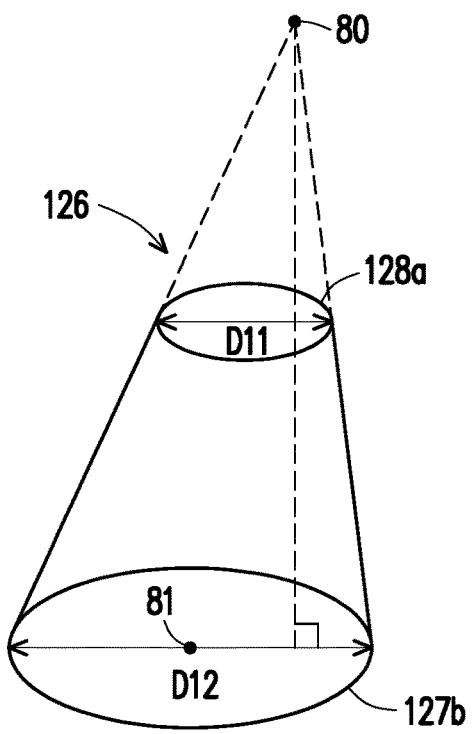

FIG. 4B and FIG. 4C are the examples that the shape of the top surface 128a and the bottom surface 127b are circular. The diameter D11 of the top surface 128a is less than the diameter D12 of the bottom surface 127b. Referring to FIG. 4B, in some embodiments, the via 126 is a right truncated cone, that is, a cone with an apex 80 (shown in dotted line over the top surface 128a) that is aligned above the center 81 of the base (that is, the bottom surface 127b). Referring to FIG. 4C, in some other embodiments, the via 126 is an oblique truncated cone, that is, a cone with an apex 80 (shown in dotted line over the top surface 128a) that is not aligned above the center 81 of the base (that is, the bottom surface 127b). The other processes of the second embodiments are similar to those of the first embodiments, which will not be described again.

FIGS. 5A to 5D are schematic cross-sectional views illustrating a method of forming a package structure according to a third embodiment of the disclosure. The third embodiments differ from the foregoing embodiments in that a seed layer 222a is partially covered by a conductive layer 225 of a via 226.

Figure 5A:
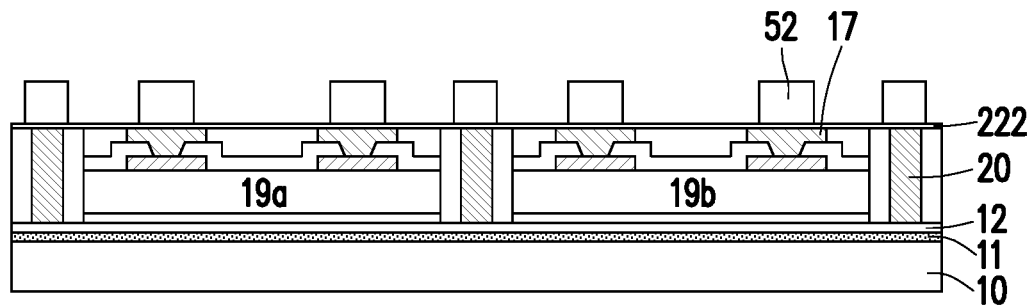
FIG. 5A to FIG. 5D are schematic cross-sectional views illustrating a method of forming a package structure according to a third embodiment of the disclosure.

Referring to FIG. 5A, a seed layer 222 is formed on the dies 19a and 19b, the material, the forming method and the structural characteristics of the seed layer 222 is similar to those of the seed layer 22 in the first embodiments, which will not be described again. Thereafter, a patterned mask layer 52 is formed on the seed layer 222 to cover a portion of the seed layer 222 on the connectors 17 and on the TIVs 20.

Figure 5B:
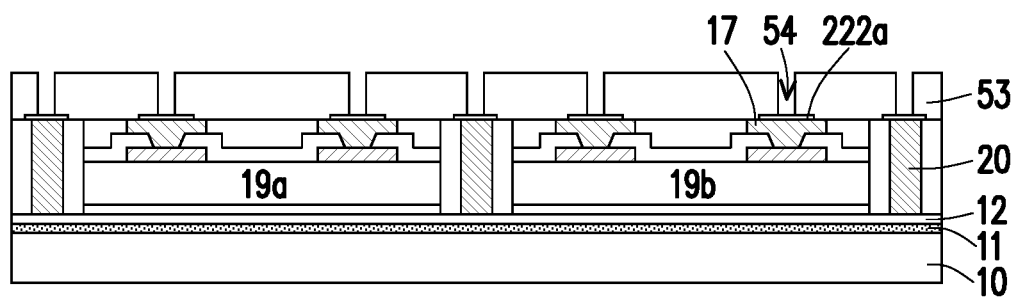

Referring to FIG. 5A and FIG. 5B, the seed layer 222 not covered by the patterned mask layer 52 is removed with the patterned mask layer 52 as a mask, such that a seed layer 222a is formed. The removal method includes an etching process such as a dry etching, wet etching, or a combination thereof. Thereafter, the patterned mask layer 52 is removed.

Referring to FIG. 5B, a patterned mask layer 53 is formed over the carrier 10, and at least covers a portion of the seed layer 222a. The patterned mask layer 53 has a plurality of openings 54, exposing a portion of the seed layer 222a.

Figure 5C:
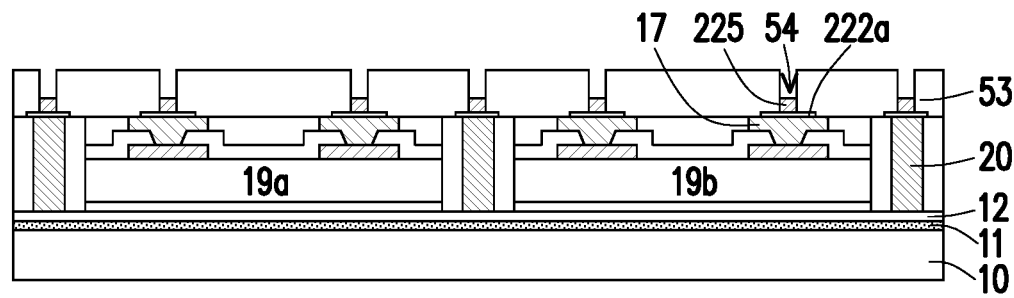
Figure 5D:
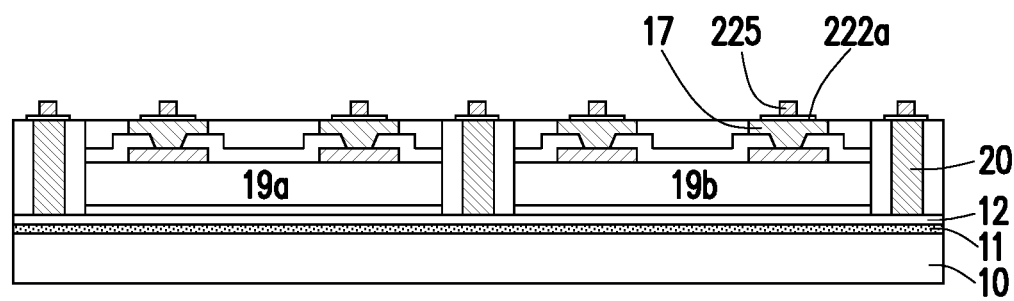

Referring to FIG. 5C and FIG. 5D, a conductive layer 225 is formed on the seed layer 222a exposed by the openings 54. The material and the forming method of the conductive layer 225 are similar to those of the conductive layer 25 in the first embodiment. Thereafter, the patterned mask layer 53 is removed.

Referring to FIG. 5D, the conductive layer 225 and the seed layer 222a form a via 226. In this embodiment, the seed layer 222a of the via 226 is partially covered by the conductive layer 225. The details are described as below.

Figure 6A:
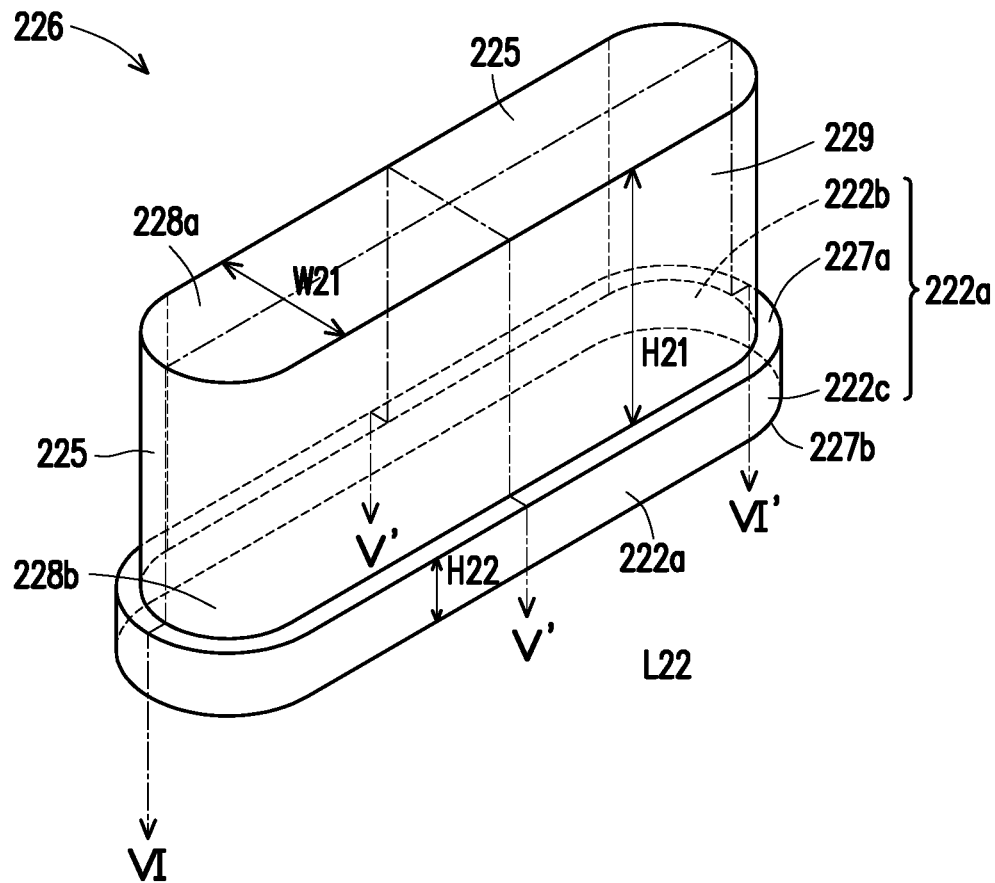
FIG. 6A and FIG. 6B are perspective views of a via of the package structure according to the third embodiment of the disclosure.
Figure 6B:
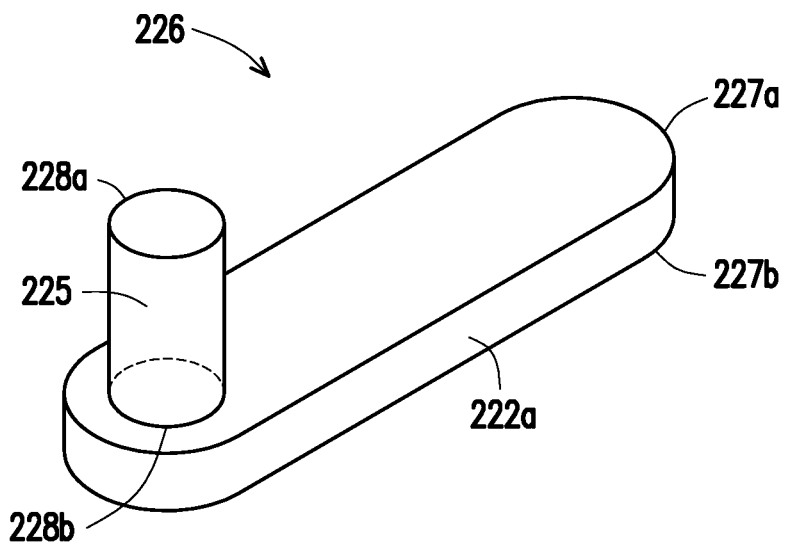

Referring to FIG. 6A and FIG. 6B, the via 226 includes the conductive layer 225 and the seed layer 222a. The seed layer 222a has a bottom surface 227b and a top surface 227a, which are larger than a bottom surface 228b and a top surface 228a of the conductive layer 225. In other words, the seed layer 222a serves as a larger base under the conductive layer 225 to be in electrical contact with the connector 17 of the die 19a or 19b. The top surface 227a of the seed layer 222a is partially covered by the bottom surface 228b of the conductive layer 225, such that a portion of the seed layer 222a protrudes from the sidewalls 229 of the conductive layer 225. In other words, the seed layer 222a includes a body part 222b and an extension part 222c connected to the body part 222b. The body part 222b is underlying and covered by the conductive layer 225. The extension part 222c surrounds the body part 222b and protrudes from the sidewalls 229 of the conductive layer 225.

The seed layer 222a and the conductive layer 225 may have substantially identical shapes or different shapes, and may respectively have any shape described in FIG. 2, FIG. 3A to 3E, and FIGS. 4A to 4B or any other shape, as long as the size of the seed layer 222a is larger than the size of conductive layer 225 and protrudes from the sidewalls 229 of the conductive layer 225.

In some exemplary embodiments, the conductive layer 225 and the seed layer 222a are both elongated, as shown in FIG. 6A. In some other exemplary embodiments, the seed layer 222a is elongated, while the conductive layer 225 is not elongated, as shown in FIG. 6B.

Referring to FIG. 6A, in some embodiments, the cross-section shape along a V-V' line and a VI-VI' line of the via 226 is inverted T shaped. The area A21 of the top surface 228a of the conductive layer 225 is substantially the same as the area A21 of the bottom surface 228b of the conductive layer 225. The area A22 of the top surface 227a of the seed layer 222a is substantially the same as the area A22 of the bottom surface 227b of the seed layer 222a. The area A22 of the top/bottom surface 227a/227b of the seed layer 222a is larger than the area A21 of the top/bottom surface 228a/228b of the conductive layer 225, such that an extension part 222c of the seed layer 222a protrudes from the sidewalls 229 of the conductive layer 225. The height H21 ranges from 1 μm to 7 μm. The height H22 ranges from 0.3 μm to 1 μm.

Referring to FIG. 6B, in some embodiments in which the seed layer 222a is elongated, while the conductive layer 225 is not elongated, the shape of the seed layer 222a is substantially the same as the shape of the seed layer 222a shown in FIG. 6A, the conductive layer 225 is a cylinder, that is, the top surface 228a and the bottom surface 228b of the conductive layer 225 are circular.

After the via 226 is formed, subsequent processes similar to those of FIG. 1E to FIG. 1L of the first embodiment are performed, which will not be described again.

Figure 7:
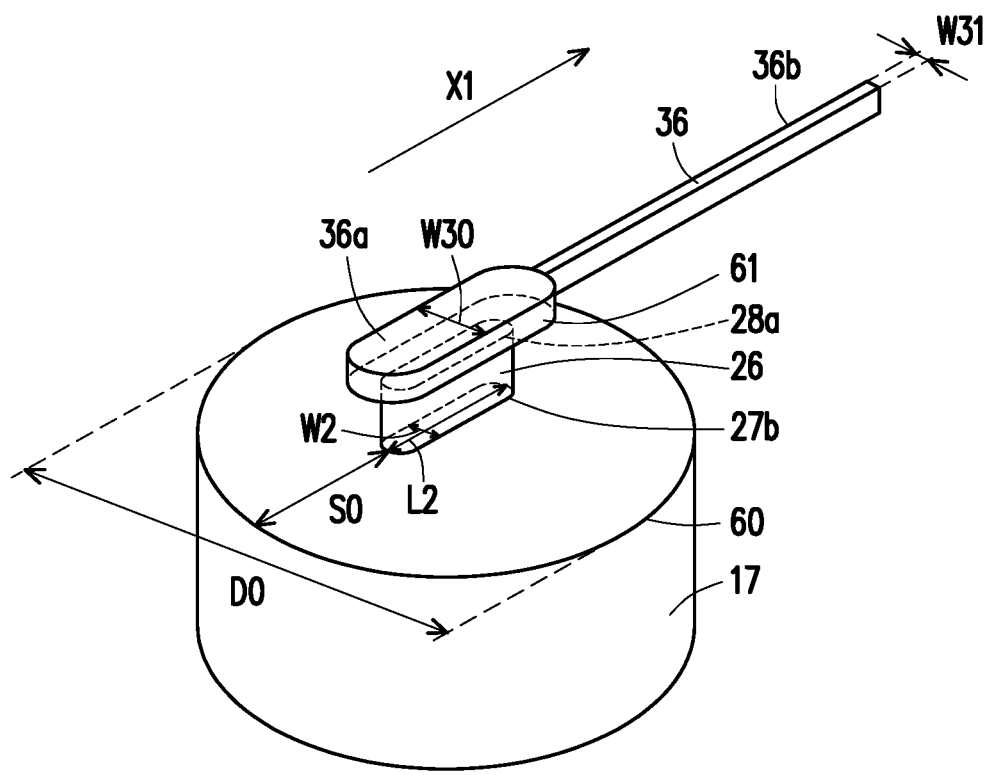
FIG. 7 is perspective view illustrating a RDL over a connector of a die according to some embodiments of the disclosure.

FIG. 7 is a perspective view of the first RDL 37 over the connector 17 of the die 19a or 19b. The first RDL 37 includes the via 26 or 126 or 226 formed in the foregoing embodiments. For the sake of brevity, FIG. 7 takes the via 26 for example.

Referring to FIG. 7, the via 26 is disposed on the connector 17 and covers a portion of the top surface 60 of the connector 17. In some exemplary embodiments, the top surface 60 of the connector 17 is circular, and the diameter DO of the top surface 60 is about 30 μm. The via 26 extends along a first direction X1, and the distance S0 between an edge of the via 26 and an edge of the connector 17 along the first direction X1 ranges from 10 μm to 15 μm. The ratio of the diameter DO of the connector 17 to the width W2 of the bottom surface 27b of the via 26 ranges from 3 to 15. The ratio of the diameter DO of the connector 17 of the via 26 to the length L2 of the bottom surface 27b ranges from 3 to 6. The trace 36 is disposed on the via 26, and also extends along the first direction X1. In some embodiments, the trace 36 includes a first part 36a and a second part 36b which are in contact with and electrically connected to each other. In some embodiments, the first part 36a is connected to an end of the second part 36b. The first part 36a is disposed on the via 26 and covers the via 26. The width W30 of the first part 36a is larger than the width W31 of the second part 36b. The bottom surface 61 of the first part 36a is in contact with and electrically connected to the top surface 28a of the via 26. The area of the bottom surface 61 of the first part 36a is larger than or substantially equals to the area A1 of the top surface 28a of the via 26.

Figure 8:
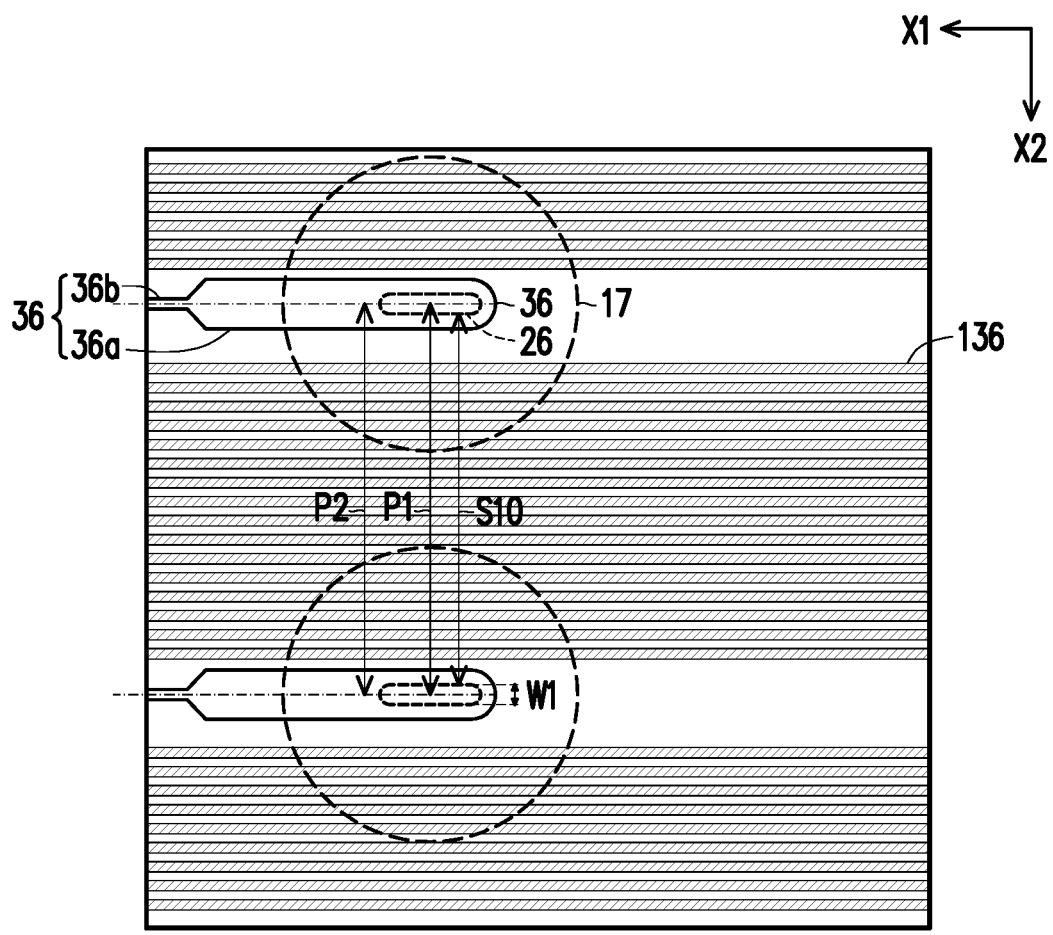
FIG. 8 is a top view of a RDL over a connector of a die according to some embodiments of disclosure.

FIG. 8 illustrates a relationship between the two vias 26.

Referring to FIG. 8, the via 26 and the trace 36 extend in the first direction X1, and arranged in a second direction X2. In some embodiments, the two traces 36 and the two underlying via 26 are parallel disposed, and the pitch P1 of the two vias 26 substantially equals to the pitch P2 of the two traces 36. The space S10 between the two vias 26 ranges from 30 μm to 38 μm. A plurality of traces 136 pass through the two vias 26. Because the via 26 is elongated, a sufficient contact area between the via 26 and the connector 17 is provided. Further, the via 26 extends along the first direction X1 the same as that of the trace 36, and the width W1 of the via 26 is small, thus the space S10 between the two vias is increased and large enough to allow more traces 136 to pass through.

In summary, in the disclosed package structure, the via is elongated, or the area of the bottom surface of the via is larger than the top surface of the via (such as a tapered via), therefore, the contact area between the via and the connector of the die is large enough to provide a good contact property and a good conductive property.

In accordance with some embodiments of the disclosure, a method of manufacturing a package structure includes the following processes. A die is provided. An encapsulant is formed laterally aside the die. A first dielectric layer is formed on the encapsulant and the die. A first redistribution layer is formed to penetrate through the first dielectric layer to connect to the die, the first redistribution layer includes a first via embedded in the first dielectric layer and a first trace on the first dielectric layer and connected to the first via. The first via and the first trace of the first redistribution layer are formed separately.

In accordance with alternative embodiments of the disclosure, a method of manufacturing a package structure includes the following processes. A die is provided. An encapsulant is formed to laterally encapsulate the die. A first via is formed on and electrically connected to the die. A dielectric material layer is formed on the die and the encapsulant to cover sidewalls and a top surface of the first via. A planarization process is performed on the dielectric material layer to remove a portion of the dielectric material layer on the top surface of the first via, so as to form a first dielectric layer laterally aside the first via. A first trace is formed on the first via and the dielectric layer. The first trace and the first via are connected to each other and constitute a first redistribution layer.

In accordance with some embodiments of the disclosure, a package structure includes a die, an encapsulant, a first dielectric layer, a first redistribution layer, a second dielectric layer and a second redistribution layer. The encapsulant is laterally aside the die. The first dielectric layer is on the die and the encapsulant. The first redistribution layer penetrates through the first dielectric layer to connect to the die. The first redistribution layer includes a first via and a first trace on the first via. The second dielectric layer is on the first dielectric layer and the first redistribution layer. The second redistribution layer penetrates through the second dielectric layer to connect to the first redistribution layer. The second redistribution layer includes a second via and a second trace connected to the second via. An interface exists between the first via and the first trace, and there is free of interface between the second via and the second trace.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A method of manufacturing a package structure, comprising:
providing a die;
forming an encapsulant laterally aside the die;
forming a first dielectric layer on the encapsulant and the die; and
forming a first redistribution layer penetrating through the first dielectric layer to connect to the die, the first redistribution layer comprises a first via embedded in the first dielectric layer and a first trace on the first dielectric layer and connected to the first via,
wherein the first via and the first trace of the first redistribution layer are formed separately, wherein forming the first redistribution layer comprises:
forming the first via before forming the first dielectric layer, wherein the first dielectric layer is formed to have a top surface level with a top surface of the first via; and
forming the first trace after forming the first dielectric layer, wherein the first trace is formed to be in physical contact with the top surface of the first dielectric layer and the top surface of the first via that are level with each other.

2. The method of claim 1, wherein the first dielectric layer is formed to cover top surfaces of the encapsulant and the die.

3. The method of claim 2, further comprising performing a treatment process on the first via before forming the first dielectric layer, such that the first via is tapered away from the die.

4. The method of claim 3, wherein the treatment process comprises an isotropic etch process.

5. The method of claim 2, wherein forming the first via comprises:
forming a seed material layer on the encapsulant and the die;
forming a first patterned mask layer on the seed material layer;

removing a portion of the seed material layer exposed by the first patterned mask layer, and the first seed layer is formed;
removing the first patterned mask layer;
forming a second patterned mask layer on the die and the encapsulant to cover a first portion of the first seed layer and expose a second portion of the first seed layer;
forming a first conductive layer on the second portion of the first seed layer exposed by the second patterned mask layer; and
removing the second patterned mask layer.

6. The method of claim 1, further comprising:
forming a second dielectric layer on the first dielectric layer and the first redistribution layer; and
forming a second redistribution layer penetrating through the second dielectric layer to connect to the first redistribution layer, the second redistribution layer comprises a second via embedded in the second dielectric layer and a second trace on the second dielectric layer,
wherein the second via and the second trace are simultaneously formed after forming the second dielectric layer.

7. A method of manufacturing a package structure, comprising:
providing a die;
forming an encapsulant to laterally encapsulate the die;
forming a first via on and electrically connected to the die;
forming a dielectric material layer on the die and the encapsulant to cover sidewalls and a top surface of the first via, and cover top surfaces of the encapsulant and the die;
removing a portion of the dielectric material layer on the top surface of the first via to form a first dielectric layer laterally aside the first via; and
forming a first trace on the first via and the first dielectric layer, wherein the first trace and the first via are connected to each other and constitute a first redistribution layer.

8. The method of claim 7, wherein the portion of the dielectric material layer is removed by a planarization process.

9. The method of claim 7, wherein
forming the first via comprises forming a first seed layer and forming a first conductive layer on the first seed layer;
forming the first trace comprises forming a second seed layer and forming a second conductive layer on the second seed layer; and
the second seed layer is separated from the first seed layer by the first conductive layer therebetween.

10. The method of claim 9, wherein the second conductive layer is separated from the first conductive layer by the second seed layer therebetween.

11. The method of claim 9, wherein forming the first seed layer and the first conductive layer comprises:
forming a seed material layer on the die and the encapsulant;
patterning the seed material layer to form the first seed layer;
forming a patterned mask layer on the die and the encapsulant to partially cover the first seed layer;
forming the first conductive layer on the first seed layer exposed by the patterned mask layer; and
removing the patterned mask layer,
wherein the first seed layer comprises an extending portion laterally protruding from sidewalls of the first conductive layer.

12. The method of claim 11, wherein the dielectric material layer is formed to cover sidewalls and a top surface of the first conductive layer, and sidewalls and a top surface of the extending portion of the first seed layer.

13. The method of claim 7, further comprising performing an isotropic process on the first via after forming the first via and before forming the dielectric material layer, such that an area of a bottom surface of the first via is larger than an area of a top surface of the first via.

14. The method of claim 7, further comprising:
forming a second dielectric layer on the first dielectric layer and the first redistribution layer;
patterning the second dielectric layer to form an opening exposing a portion of a top surface of the first trace of the first redistribution layer; and
forming a second redistribution layer on the second dielectric layer and filling into the opening to connect to the first redistribution layer.

15. The method of claim 14, wherein forming the second redistribution layer comprises forming a continuous seed layer and a continuous conductive layer on the continuous seed layer.

16. A method of manufacturing a package structure, comprising:
providing a die;
forming an encapsulant to encapsulate sidewalls of the die;
forming at least one via to connect to the die, comprising:
forming a first seed material layer on the die and the encapsulant;
patterning the first seed material layer to form a first seed layer; and
forming a first conductive layer on a first portion of the first seed layer, and a second portion of the first seed layer laterally protrudes from sidewalls of the first conductive layer;
forming a dielectric layer on the encapsulant and the die to laterally cover the at least one via; and
forming a trace on the at least one via and the dielectric layer, wherein the trace and the at least one via are electrically connected to each other and constitute a redistribution layer connected to the die.

17. The method of claim 16, wherein forming the first conductive layer comprises:
forming a first patterned mask layer on the die and the encapsulant to partially cover the first seed material layer, the first patterned mask layer has an opening exposing the first portion of the first seed material layer;
forming the first conductive layer on the first portion of the first seed material layer within the opening of the first patterned mask layer; and
removing the first patterned mask layer.

18. The method of claim 16, wherein patterning the first seed material layer comprises:
forming an additional patterned mask layer on the first seed material layer;
removing a portion of the first seed material layer exposed by the additional patterned mask layer; and
removing the additional patterned mask layer.

19. The method of claim 16, wherein forming the trace comprises:
forming a second seed material layer on the dielectric layer and the at least one via;
forming a second patterned mask layer to partially cover the second seed material layer;

forming a second conductive layer on a portion of the second seed material layer exposed by the second patterned mask layer; and removing the second patterned mask layer and the other portion of the second seed material layer exposed by the second conductive layer.

20. The method of claim 16, further comprising:

forming a through via laterally aside the die, wherein the encapsulant is formed to further encapsulate sidewalls of the through via;

wherein forming the at least one via comprises forming a first via landing on the die; and forming a second via landing on the through via.

* * * * *